United States Patent
Bartl et al.

(10) Patent No.: US 6,985,751 B2
(45) Date of Patent: Jan. 10, 2006

(54) COMBINED OPEN AND CLOSED LOOP POWER CONTROL WITH DIFFERENTIAL MEASUREMENT

(75) Inventors: Thomas Bartl, San Diego, CA (US); John Malaugh, San Diego, CA (US)

(73) Assignee: Siemens Communications, Inc., Boca Raton, FL (US)

( * ) Notice: Subject to any disclaimer, the term of this patent is extended or adjusted under 35 U.S.C. 154(b) by 520 days.

(21) Appl. No.: 10/092,690

(22) Filed: Mar. 7, 2002

(65) Prior Publication Data

US 2003/0176202 A1   Sep. 18, 2003

(51) Int. Cl.
*H04B 7/00* (2006.01)
*H04Q 7/20* (2006.01)

(52) U.S. Cl. ............ 455/522; 455/69; 455/13.4; 455/571; 455/572; 455/127.1; 370/317; 375/256

(58) Field of Classification Search ........... 455/522, 455/69, 13.4, 571, 572, 573, 574, 570, 127.1, 455/127.2; 370/317; 375/256
See application file for complete search history.

(56) References Cited

U.S. PATENT DOCUMENTS 6,285,863 B1 * 9/2001 Zhang ................. 455/234.1
6,580,901 B1 * 6/2003 Mochizuki ............ 455/127.1
2002/0118653 A1 * 8/2002 Lomp et al. ............ 370/311
2002/0142791 A1 * 10/2002 Chen et al. ............ 455/522

* cited by examiner

*Primary Examiner*—Nick Corsaro
*Assistant Examiner*—Shaima Q. Aminzay

(57) ABSTRACT

A power control system and method for a wireless telephone employs an open loop technique for relatively low power levels and a closed loop technique at higher power levels. In the open loop technique, a wireless telephone (104, 106, 108) stores a phasing table of automatic power control (APC) values for the power levels (which are used to control upconverter gain levels measured at different channels. In operation, a power controller (322) reads the power level and reads the APC value in the table. Another table stores the APC value for one power level as the channel and temperature are varied. This value is interpolated, as needed, during operation. The APC value for the open loop approach is determined by reading the input channel; finding the closest higher and closest lower channels in the temperature-channel table; interpolating between APC values for the temperature column of the closest lower temperature, to get the actual value. The difference between this value and the APC value for the actual power level in the phasing table is then obtained.

15 Claims, 2 Drawing Sheets

COMBINED OPEN AND CLOSED LOOP POWER CONTROL WITH DIFFERENTIAL MEASUREMENT

BACKGROUND OF THE INVENTION

The present invention relates to telecommunications devices and, in particular, to an improved automatic power control loop for a wireless telecommunications transmitter.

The Federal Communications Commission (FCC) regulates the use of the radio frequency (RF) spectrum in the United States. Users of allocated bandwidth of the RF spectrum must take measures to ensure that radiated emissions inside and outside the allocated bandwidth are maintained within acceptable levels to avoid interfering with other users' operating in the same or other bandwidths. For example, users of cellular telephone systems must ensure that they are compliant with the level of radiated emissions allowable inside or outside the channels they have been assigned.

Cellular telephones use variable power control to adjust the output power to the requirements of the system specification and additionally to limit the highest output power level to minimize specific absorption rates (SAR) and out of channel radiation such as adjacent channel power ratio (ACPR) and spurious emissions.

Components in the transmit chain, and particularly the power amplifier, tend to have a relatively wide variation in gain with respect to unit, temperature and frequency. To maintain a given output power over all units, temperature, and frequency would typically require a multidimensional calibration table. Some phone manufacturers use an expensive power detection circuit that allows closed loop power control over the entire power range of the phone.

On time division multiple access (TDMA) phones, transmit power must conform to TIA/EIA specification IS136-270. This specification details ten power levels and four mobile classes. A class IV mobile must unit transmit the power detailed in the following table:

| POWER LEVEL | OUTPUT POWER |
| --- | --- |
| 0 | 28 dBm |
| 1 | 28 dBm |
| 2 | 28 dBm |
| 3 | 24 dBm |
| 4 | 20 dBm |
| 5 | 16 dBm |
| 6 | 12 dBm |
| 7 | 8 dBm |
| 8 | 4 dBm |
| 9 | 0 dBm |
| 10 | −4 dBm |

Power Levels 0 through 7 must be accurate to plus or minus 3 dB, and Power Levels 8, 9 and 10 can be less accurate.

SUMMARY OF THE INVENTION

A better understanding of these and other specific embodiments of the invention is obtained when the following detailed description is considered in conjunction with the following drawings.

DETAILED DESCRIPTION OF EMBODIMENTS OF THE INVENTION

A power control system and method for a wireless telephone according to an embodiment of the present invention employs an open loop technique for relatively low power levels and a closed loop technique at higher power levels. In the open loop technique, the wireless telephone stores a phasing table of automatic power control (APC) values for the power levels (which are used to control upconverter gain levels measured at different channels. In operation, a power controller reads the power level and reads the APC value in the table. Another table stores the APC value for one power level as the channel and temperature are varied. This value is interpolated, as needed, during operation. The APC value for the open loop approach is determined by reading the input channel; finding the closest higher and closest lower channels in the temperature-channel table; interpolating between APC values for the temperature column of the closest lower temperature, to get the actual value. The difference between this value and the APC value for the actual power level in the phasing table is then obtained.

In the closed loop approach, the actual power output is read from a power detector and the APC value is adjusted until the output of the power detector corresponds to the value which gives the required power level. A phasing table of power levels and power detector values is used. To factory calibrate these values, the APC value is adjusted until the nominal power for each power level is output and the power detector value is stored. A two pole IIR (Infinite Impulse Response) filter may be used to filter the power detector output.

In operation, the closed loop control algorithm runs every transmit burst and reads the power detector when the power is off; reads the power detector when the transmitter is on and subtracts these two numbers to obtain the actual RF power level; from the power level, looks up the desired RF power value in the phasing table to find an RF power error; and runs a servo control loop calculation to find the APC value needed to correct the error.

Figure 1:
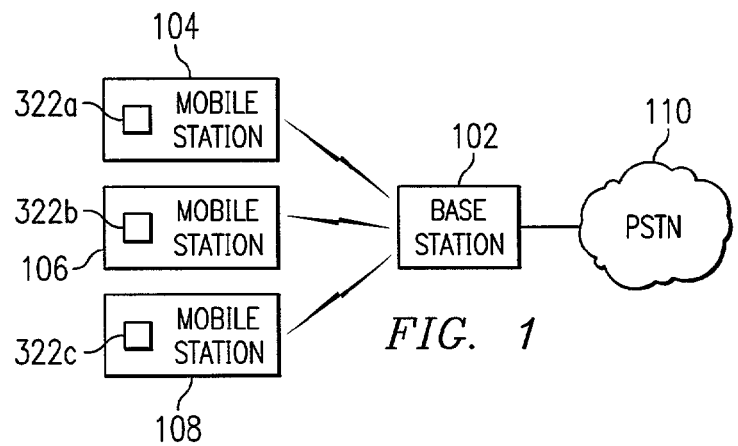
FIG. 1 is a diagram illustrating a telecommunications system according to an of the present invention.

Turning now to the drawings and, with particular attention to FIG. 1, a diagram of a telecommunications system 100 according to an embodiment of the present invention is shown. The system 100 may be, for example, an IS-136 or IS-95 or GSM based telecommunications network. The system 100 includes at least one base station 102 serving a particular geographic region and a plurality of mobile stations 104, 106, 108 which may move in and out of the region. The base station 102 couples the mobile stations to the public switched telephone network (PSTN) 110. In addition, the mobile stations 104, 106, 108 include transmit power control units 322a–322c, respectively, according to embodiments of the present invention, as will be explained in greater detail below.

Figure 2:
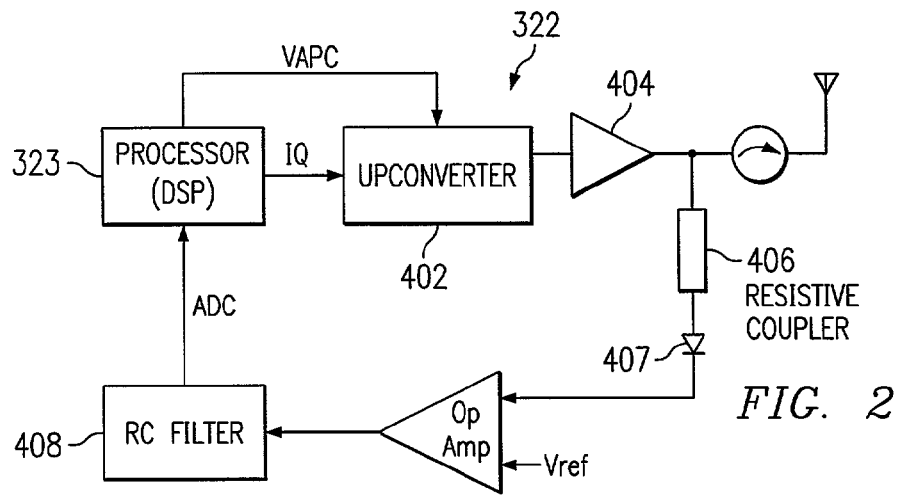
FIG. 2 is a diagram of an exemplary baseband RF transmitter according to an embodiment of the present invention.

Turning now to FIG. 2, a diagram illustrating a mobile station and power control system 322, typically present in the mobile stations 104, 106, 108, according to an embodiment of the invention is shown. The mobile station includes a processor 323, such as a baseband processor or digital signal processor (DSP), upconverter 402, amplifier 404, a power detector such as a resistive coupler 406, a diode 407, operational amplifier, and loop filter 408. As will be explained in greater detail below, the processor 323 generates an automatic power control (APC) or power set value Vapc as well as providing the in-phase and quadrature signaling to the upconverter 402. The APC value is provided to control one or more gain stages of the upconverter 402. The resistive coupler 406 provides a measurement of the output power which may be compared to a reference power level Vref, filtered by filter 408, and provided back to the processor 323.

Figure 3:
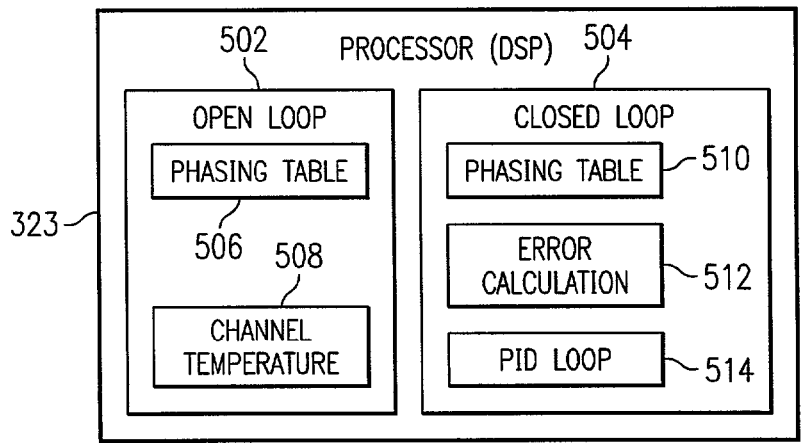
FIG. 3 is a diagram illustrating exemplary functional modules according to an embodiment of the present invention.

FIG. 3 illustrates functional units for implementing power control according to embodiments of the present invention. The functional units 502, 504 may be implemented as software modules running on one or more processors or controllers, such as DSP 323. Shown are an open loop module 502 and a closed loop module 504. The open loop module includes a phasing table 506 and a temperature-channel table 508; the closed loop module 504 includes a phasing table 510 and an APC error calculation module 512, and a PID (Proportional Integral Derivative) calculation loop 514, as will be explained in greater detail below.

More particularly, in a low power mode, an open loop power control approach is used with the open loop module 502, while in high power modes, a closed loop approach is used with the closed loop module 504. In one embodiment, "low power" refers to IS-136 power levels of 8–10, and "high power" refers to IS-136 power levels of 0–7. As will be described in greater detail below, in the open loop mode, one or more factory-calibrated lookup tables 506, 508 are used for setting the power level. In the closed loop mode, the actual power output is read and used in a differential approach to adjust the power set level.

More particularly, in the open loop mode, the APC value is calculated from the power level, RF channel, RF band (e.g., cell band (800 MHz) or PCS (1900 MHz)), and temperature. In operation, the system (i.e., the open loop module 502) reads the power level and band and looks up the corresponding APC value.

Each mobile station or wireless telephone is individually phased with a table 506 of APC value for each power level. In the factory, the APC value is adjusted until the nominal power for each power level is output from the phone, and that value is stored in a table. The channels used to calculate these values are also stored. In open loop power control, the software 502 reads the power level and band, and looks up the corresponding APC value in one of the tables. Power is set by sending the APC value to the upconverter 402. Temperature is read from a thermistor (not shown).

| POWER LEVEL | APC VALUE |
| --- | --- |
| 0 | 1000 |
| 1 | 1000 |
| 2 | 1000 |
| 3 | 900 |
| 4 | 800 |
| 5 | 700 |
| 6 | 500 |
| 7 | 300 |

-continued

| POWER LEVEL | APC VALUE |
| --- | --- |
| 8 | 200 |
| 9 | 100 |
| 10 | 50 | then the APC value for power level 3 is 900.

In addition to the phasing table 506, each wireless telephone has a two-dimensional table 508 that gives the APC value for power level 0 for the average phone as the channel and temperature is varied. This table 508 is generated by setting a number of phones to a specific channel and temperature, then adjusting the APC value until the phone outputs the nominal power for power level zero. The test is related for various channels and temperature settings, and the results for each phone are averaged.

The open loop module 502 "phases" this table as part of the initialization process. It determines the nominal APC value for the channel used to phase the phone by finding the closest higher channel and closest lower channel in the table, and interpolating between the room temperature APC values in the table. For example, if the table 508 is:

| TEMPERATURE → CHANNEL↓ | −10° C. | 0° C. | 10° C. | 20° C. |
| --- | --- | --- | --- | --- |
| 1 | 1000 | 1005 | 1010 | 1020 |
| 50 | 998 | 1003 | 1008 | 1015 |
| 100 | 990 | 995 | 1000 | 1010 |
| 300 | 900 | 905 | 910 | 1000 |
| 500 | 890 | 895 | 900 | 900 |
| 900 | 900 | 905 | 910 | 920 |
| 1500 | 950 | 955 | 960 | 980 |
| 1900 | 970 | 975 | 980 | 1000 |
| 1999 | 990 | 995 | 1000 | 1010 | and the channel used to phase the phone is 400, then:

APC value at channel 300 and 20° C. is 1000,

APC value at channel 500 and 20° C. is 900,

APC value at channel 400 and 20° C. is (1000+900)/2=950.

This value is subtracted from the actual APC value for this phone (1000 from the phasing table 506), so there is a difference of 50 between the actual and nominal values. Then, to phase the table, 50 is added to all values.

Figure 4:
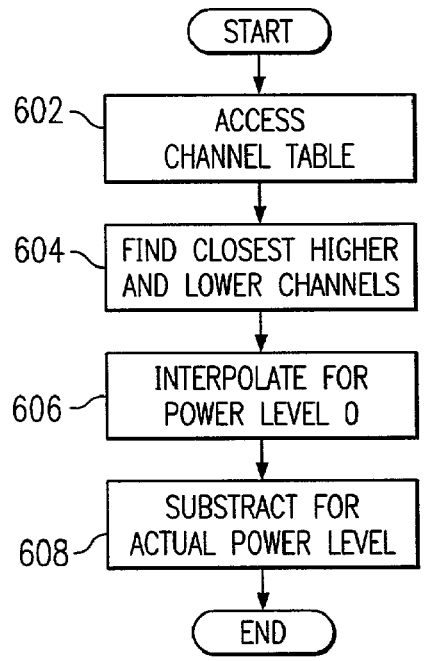
FIG. 4 is a flowchart illustrating operation of an embodiment of the present invention.

When the wireless telephone tunes to a channel, and needs to output a transmit burst, the open loop module 502 computes the APC value needed as shown in FIG. 4. In a step 602, the open loop module 502 accesses the channel-temperature table 508. In step 604, the open loop module 502 finds the closest higher channel and closest lower channel in the phased temperature/channel table 508. In step 606, the open loop module 502 interpolates between the APC values for the temperature column of the closest lower temperature. This will give the actual value power level 0. Next, in step 608, the open loop module 502 subtracts the difference between the APC value for power level 0 and the APC value for the actual power level in the phasing table.

For example, if the temperature/channel table 508 is:

| TEMPERATURE → <br> CHANNEL ↓ | −10° C. | 0° C. | 10° C. | 20° C. |
|---|---|---|---|---|
| 1 | 1000 | 1005 | 1010 | 1020 |
| 50 | 998 | 1003 | 1008 | 1015 |
| 100 | 990 | 995 | 1000 | 1010 |
| 300 | 900 | 905 | 910 | 1000 |
| 500 | 890 | 895 | 900 | 900 |
| 900 | 900 | 905 | 910 | 920 |
| 1500 | 950 | 955 | 960 | 980 |
| 1900 | 970 | 975 | 980 | 1000 |
| 1999 | 990 | 995 | 1000 | 1010 | and if selected channel is 1700, and the temperature is 20° C., then

APC value at channel 1500 and is 980,
APC value at channel 1900 and 20° C. is 1000,
APC value at channel 400 and 20° C. is (980+1000)/2=990.

If the phasing table 506 is:

| POWER LEVEL | APC VALUE |
|---|---|
| 0 | 1000 |
| 1 | 1000 |
| 2 | 1000 |
| 3 | 900 |
| 4 | 800 |
| 5 | 700 |
| 6 | 500 |
| 7 | 300 |
| 8 | 200 |
| 9 | 100 |
| 10 | 50 | and if the power level is 3, then:
the APC value from the temperature/channel calculation is 990,
the phased value for power level 0 is 1000,
the phased value for power level 3 is 900,
the actual APC value is 990−1000+900=890.

The APC value must be adjusted as the temperature changes. This could be done by recalculating the APC using the method described above, but the calculation can be relatively time consuming. To save time, an APC value versus temperature table may be pre-calculated every time the channel or the power level changes, and that table is used to look up the new APC value when the temperature changes.

In closed loop power control, the actual power output is read from the power detector (e.g., coupler 406), and the APC value adjusted until the output of the power detector 406 corresponds to the value the required power level. A differential approach is used, in which a power level measurement during a burst (i.e., transmitter is on) and after a burst (i.e., transmitter is off) are obtained. The difference of the two values is then used for the power control adjustment. By using this differential measurement approach for closed loop, a temperature phasing of the phone in the factory or a temperature correction table is not necessary. Also, the differential measurement is relatively accurate (which may be especially important for the highest power level) by leveling out offset errors in the analog-to-digital converter.

More particularly, in certain embodiments, power is set by sending a value to the DSP 323. This value is converted to a voltage by a digital-to-analog converter, and applied to the gain stage of the up converter 402.

Actual power can be read from the power detector 406, which is a hardware circuit that rectifies the RF transmit waveform, and smoothes it with an RC filter 408 to a DC level. The RC filter time constant is chosen in such a way that the settle time is slow enough to offer the best possible accuracy but also settles within the burst length of 6.6 ms. In certain embodiments, this DC level is digitized with a 10 bit ADC, and can read by the DSP 323 or other control processor. An operational amplifier (OPAMP) is used in conjunction with a temperature compensation diode to shift the detected voltage in the useful input voltage range of the DSP 323. It is noted that, in the embodiment illustrated, the diode biasing voltage drop offsets the reading, and since the diode voltage drifts with temperature, the offset also drifts with temperature. This effect is not fully compensated by the compensation diode. The diode offset, as well as other temperature variations, is removed by reading the output of the power detector 406 when the transmitter is off (between bursts) and subtracting this value from the reading when the transmitter is on.

Each wireless telephone is individually phased with a table 510 of power detector values for each power level. In the factory, the APC value is adjusted until the nominal power for each power level is output from the telephone, then the output of the power detector 406 is stored in a table 510. In embodiments in which the mobile station or telephone is capable of operation in more than one frequency band (e.g., cell band or PCS), a table may be provided for each band.

A typical phasing table 510 is:

| POWER LEVEL | POWER DETECTOR VALUE |
|---|---|
| 0 | 1000 |
| 1 | 1000 |
| 2 | 1000 |
| 3 | 900 |
| 4 | 800 |
| 5 | 700 |
| 6 | 500 |
| 7 | 300 |
| 8 | 200 |
| 9 | 100 |
| 10 | 50 |

The closed loop module 504 includes a function to read the power detector 406 and pass the value to the factory phasing equipment over a serial port (not shown). To prevent incorrect values being used for the phasing table 510, the output of the power detector 406 may be filtered. The filter may need time to settle, so the module 504 includes a second function that determines when the output is stable.

In one embodiment, the closed loop module 504 uses a two-pole IIR filter 408 to smooth the power detector output. This digital filter is the bilinear transform of a two pole analog filter with a cut off frequency of 1.5 Hz, and a Q of 0.6 at a sampling rate of 20 ms (one sample per burst). This results in IIR filter constants of

| B0 | 38 |
|---|---|
| B1 | −65 |
| B2 | 28 |

Filtered samples are stored in a memory array (not shown), and the filter output is declared stable if the maximum difference of the last 6 samples is 2 counts or less. To speed up the filter settling time, the module 504 may "pre-load" the filter delay elements with the current power detector value whenever the APC value is changed.

Figure 5:
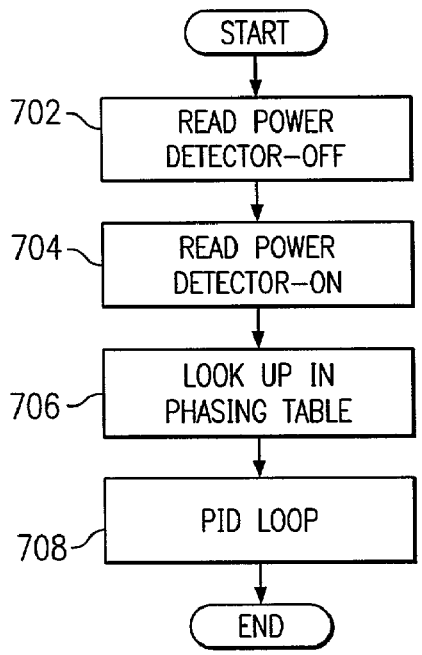
FIG. 5 is a flowchart illustrating operation of an embodiment of the present invention.

FIG. 5 illustrates operation of the closed loop power control method which, in one embodiment, runs every 20 ms (every transmit burst). In a step 702, the closed loop module 504 reads the power detector 406 when the transmitter is off. In a step 704, the module 504 reads the power detector 406 when the transmitter is on, and subtracts the transmitter off value to give the actual RF power value. In step 706, the module 504 uses the power level to look up the desired RF power value in the phasing table 510, and subtracts the actual RF power value to find the RF error. In step 708, the module 504 runs a servo control loop calculation to find the APC value needed to correct for the RF error.

The servo control algorithm may be implemented as a classic "PID" (Proportional-Integral-Derivative) control loop, but using only the "I" term. In certain embodiments, a loop constant of 0.05 gives a "critically damped" servo response. To speed up the algorithm, integer math may be used, with the loop constant changed to the fractional value 5/100.

When the power level is changed, the normal action of the servo control loop would be to slowly ramp the transmit power to the new value. To speed up this action, the open loop power control estimate is used to output the first pulse after a power level change. The closed loop power control takes over after the first pulse. This method may also be used after a channel change.

The invention described in the above detailed description is not intended to be limited to the specific form set forth herein, but is intended to cover such alternatives, modifications and equivalents as can reasonably be included within the spirit and scope of the appended claims.

What is claimed is:

1. A telecommunications device, comprising:
an open loop power controller adapted to maintain a first phasing table and a channel-temperature table;
a closed loop power controller adapted to maintain a second phasing table and receive a power detector output;
wherein said open loop power controller is adapted to provide a power set (APC) value in a first mode and said closed loop power controller is adapted to provide said power set value in a second mode, and in said second mode, said closed loop power controller receives said power detector output during a transmit burst and after a transmit burst, said first mode comprising a low power mode, said second mode comprising a high power mode.

2. A telecommunications device, comprising:
an open loop power controller adapted to maintain a first phasing table and a channel-temperature table;
a closed loop power controller adapted to maintain a second phasing table and receive a power detector output;
wherein said open loop power controller is adapted to provide a power set (APC) value in a first mode and said closed loop power controller is adapted to provide said power set value in a second mode, and in said second mode, said closed loop power controller receives said power detector output during a transmit burst and after a transmit burst;

said first phasing table comprising pre-initialized power level and power set values.

3. A telecommunications device in accordance with claim 2, said second phasing table comprising pre-initialized power detector and power level values.

4. A telecommunications device in accordance with claim 2, said channel temperature table comprising a two-dimensional table of power set values with temperature and channel.

5. A telecommunications method for controlling transmit power in a wireless telecommunications device, comprising:
initializing first and second phasing tables, the first phasing table comprising pre-initialized power level and power set values, said second phasing table comprising pre-initialized power detector and power level values;
initializing a channel-temperature table, said channel temperature table comprising a two-dimensional table of power set values with temperature and channel;
generating a power set value using said first phasing table and said channel-temperature table in an open loop mode; and
generating a power set value by reading a power detector and accessing said second phasing table in a closed loop mode, wherein in said second mode said power detector is read while a transmitter is on and while a transmitter is off.

6. A method in accordance with claim 5, said initializing a first phasing table comprising adjusting the APC value until the nominal power for each power level is output from the telecommunications device and storing that value is stored in the first phasing table.

7. A method in accordance with claim 6, wherein said initializing said channel-temperature table comprising setting a number of telecommunications devices to a specific channel and temperature;
adjusting the APC values of the telecommunications devices until the telecommunications devices output the nominal power for power level zero; and
averaging the results for each telecommunications device.

8. A method in accordance with claim 5, said generating a power set value in an open loop mode comprising determining a nominal APC value for the channel used to phase the telecommunications device by finding the closest higher channel and closest lower channel in the table, and interpolating between the room temperature APC values in the table.

9. A method in accordance with claim 5, said initializing said second phasing table comprising adjusting the APC value until the nominal power for each power level is output from the telecommunications device and storing the output of the power detector in the table.

10. A method in accordance with claim 9, said generating a power set value in a closed loop mode comprising:
reading the power detector to get an actual RF power value;
looking up the desired RF power value in the second phasing table;
obtaining an RF error; and
running a servo control loop calculation to find the APC value needed to correct for the RF error.

11. A telecommunications method, comprising:
providing an open loop power controller adapted to maintain a first phasing table and a channel-temperature table;
providing a closed loop power controller adapted to maintain a second phasing table and receive a power detector output;

wherein said open loop power controller is adapted to provide a power set (APC) value in a first low power mode and said closed loop power controller is adapted to provide said power set value in a second high power mode, said closed loop power controller receives said power detector output during a transmit burst and receives a power detector output after a transmit burst and uses the difference between the outputs to derive said APC value.

12. A telecommunications method, comprising:
providing an open loop power controller adapted to maintain a first phasing table and a channel-temperature table;
providing a closed loop power controller adapted to maintain a second phasing table and receive a power detector output;
wherein said open loop power controller is adapted to provide a power set (APC) value in a first mode and said closed loop power controller is adapted to provide said power set value in a second mode, said closed loop power controller receives said power detector output during a transmit burst and after a transmit burst; said first phasing table comprising pre-initialized power level and power set values.

13. A telecommunications method in accordance with claim 12, said second phasing table comprising pre-initialized power detector and power level values.

14. A telecommunications method in accordance with claim 12, said channel temperature table comprising a two-dimensional table of power set values with temperature and channel.

15. A telecommunications device, comprising:
an open loop power controller adapted to provide a automatic power control (APC) value in a low power mode and based on a channel-temperature table;
a closed loop power controller adapted to provide an APC value in a high power mode;
wherein in said high power mode, said closed loop power controller receives a power detector output during a transmit burst and receives a power detector output after a transmit burst and uses the difference between the outputs to derive said APC value.

* * * * *